(12) United States Patent
McAllister et al.

(10) Patent No.: US 6,954,984 B2
(45) Date of Patent: Oct. 18, 2005

(54) LAND GRID ARRAY STRUCTURE

(75) Inventors: Michael F. McAllister, Clintondale, NY (US); John G. Torok, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 221 days.

(21) Appl. No.: 10/202,726

(22) Filed: Jul. 25, 2002

(65) Prior Publication Data

US 2004/0016114 A1 Jan. 29, 2004

(51) Int. Cl.[7] .............................................. H05K 3/30
(52) U.S. Cl. ........................ 29/832; 29/825; 29/827; 29/830; 29/831; 29/846; 29/854; 174/254; 174/260; 174/262
(58) Field of Search ..................... 29/401.1, 401.01, 29/401.04, 401.07–401.12, 401.16, 851, 29/846–847, 850–853, 402.01, 402.04, 402.07–402.09, 29/402.12–402.16, 831–832; 174/254, 256, 174/260–262; 257/E23.171; 361/749, 777; 438/4, 108, 118, 126, 613; 439/67

(56) References Cited

U.S. PATENT DOCUMENTS

| | | | | |
|---|---|---|---|---|
| 4,549,200 A | * | 10/1985 | Ecker et al. ................. | 174/260 |
| 4,652,974 A | * | 3/1987 | Ryan ........................... | 29/847 |
| 4,803,595 A | * | 2/1989 | Kraus et al. ................. | 361/784 |
| 5,060,116 A | * | 10/1991 | Grobman et al. ........... | 361/792 |
| 5,177,594 A | * | 1/1993 | Chance et al. .............. | 257/678 |
| 5,243,140 A | * | 9/1993 | Bhatia et al. ................ | 174/254 |
| 6,428,327 B1 | * | 8/2002 | Tamarkin et al. ............ | 439/67 |

OTHER PUBLICATIONS http://www.cinch.com/products/cinapse/index.html "CIN:: APSE High Speed Interconnect Technology" pp. 1-4.

* cited by examiner

Primary Examiner—Minh Trinh
Assistant Examiner—Donghai D. Nguyen
(74) Attorney, Agent, or Firm—Lynn L. Augspurger

(57) ABSTRACT

A Land Grid Array structure is enhanced with a flex film interposer that not only provides a Land Grid Array (LGA) electrical connection between a Multi-Chip Module (MCM) and the next level of integration such as a system board, but also provides a reliable means to implement desired Engineering Change (EC) capability as well as a means for decoupling power to ground structure to minimize switching activity effects on the System. The invention as described can be implemented for EC repair, for Capacitive Decoupling or both.

17 Claims, 7 Drawing Sheets

LAND GRID ARRAY STRUCTURE

FIELD OF THE INVENTION

This invention relates to Land Grid Array (LGA) compression connectors, and particularly to a method using LGA connectors for executing engineering changes (EC wiring) to both repair and/or implement functional changes to System boards with improvments in the LGA structure.

Trademarks: IBM® is a registered trademark of International Business Machines Corporation, Armonk, N.Y., U.S.A. Other names may be registered trademarks or product names of International Business Machines Corporation or other companies.

BACKGROUND

Before our invention a Land Grid Array structure has been made in the form of Land Grid Array (LGA) compression connectors by developed by Tyco® (Tyco electronics is a division of Tyco International Ltd) and Cinch® (Cinch Connectors, Inc., a part of Snecma, France), and we have found engineering changes have proved difficult with these devices.

We found that as higher density connectors are implemented on Systems, there is a need for interconnect schemes that permit significant I/O densities while at the same time providing an excellent signal integrity interconnection to the next level of packaging. With the advent of the Land Grid Array (LGA) structures using compression connectors as developed by Tyco, Cinch and others, the density and signal integrity problems have been addressed. However, this structure has caused a new problem to surface. Specifically, there is a need for a suitable method for executing engineering changes (EC wiring) to both repair and/or implement functional changes to System boards. In the early stages of hardware build, there are times that engineering changes are needed for the System boards. These modifications are due to a number of reasons, including architecture changes, additional functional requirements, or early user availability of imperfect hardware.

SUMMARY OF THE INVENTION

A Land Grid Array structure is enhanced with a flex film interposer that not only provides a Land Grid Array (LGA) electrical connection using Plated Through Holes in the flex film between a Multi-Chip Module (MCM) and the next level of integration such as a system board, but also provides a reliable means to implement desired Engineering Change (EC) capability as well as a means for decoupling power to ground structure to minimize switching activity effects on the System. In accordance with an embodiment of the invention for EC repair an insulating plug is applied to remove an original board net and to prevents contact to an I/O pad which in turn was connected to the original board net. The invention as described can be implemented for EC repair and for Capacitive Decoupling.

These and other improvements are set forth in the following detailed description. For a better understanding of the invention with advantages and features, refer to the description and to the drawings.

Our detailed description explains the preferred embodiments of our invention, together with advantages and features, by way of example with reference to the drawings.

DETAILED DESCRIPTION OF THE INVENTION

The invention provides a flex film interposer that not only provides a Land Grid Array (LGA) electrical connection between a Multi-Chip Module (MCM) (or similar integrated circuit type structure) and the next level of integration such as a system board, but also provides a reliable means to implement Engineering Change (EC) capability as well as a means for decoupling power to ground structure to minimize switching activity effects on the System. The invention as described can be implemented for EC repair, for Capacitive Decoupling or both. Hence, the overall value of the invention is highly enhance by this flexibility of concept application.

The LGA structure with the compression connector scheme requires an electrically insulated backing structure to counter balance the forces used to compress the chip carrier to the System board. In a typical application, this arrangement requires an insulating sheet/plate and a metallic stiffening plate. By nature of the earlier designs, the assembly prevented the access to the connector area on the board and hence prevented access to the I/O's of the chip carrier. In most applications, this was permissible. However, when engineering changes are needed to the DC and high frequency connections, the ability to maintain excellent electrical measurement characteristics is compromised and thus our new method to accommodate EC changes is required. In addition, as the trend continues to drive the packaging of circuits in higher densities and smaller areas, there is a growing need to provide large amounts of power supply capacitive decoupling as close to the chip carrier as possible.

Our Solutions:

1) Both EC Repair & Capacitive Decoupling

Figure 1:
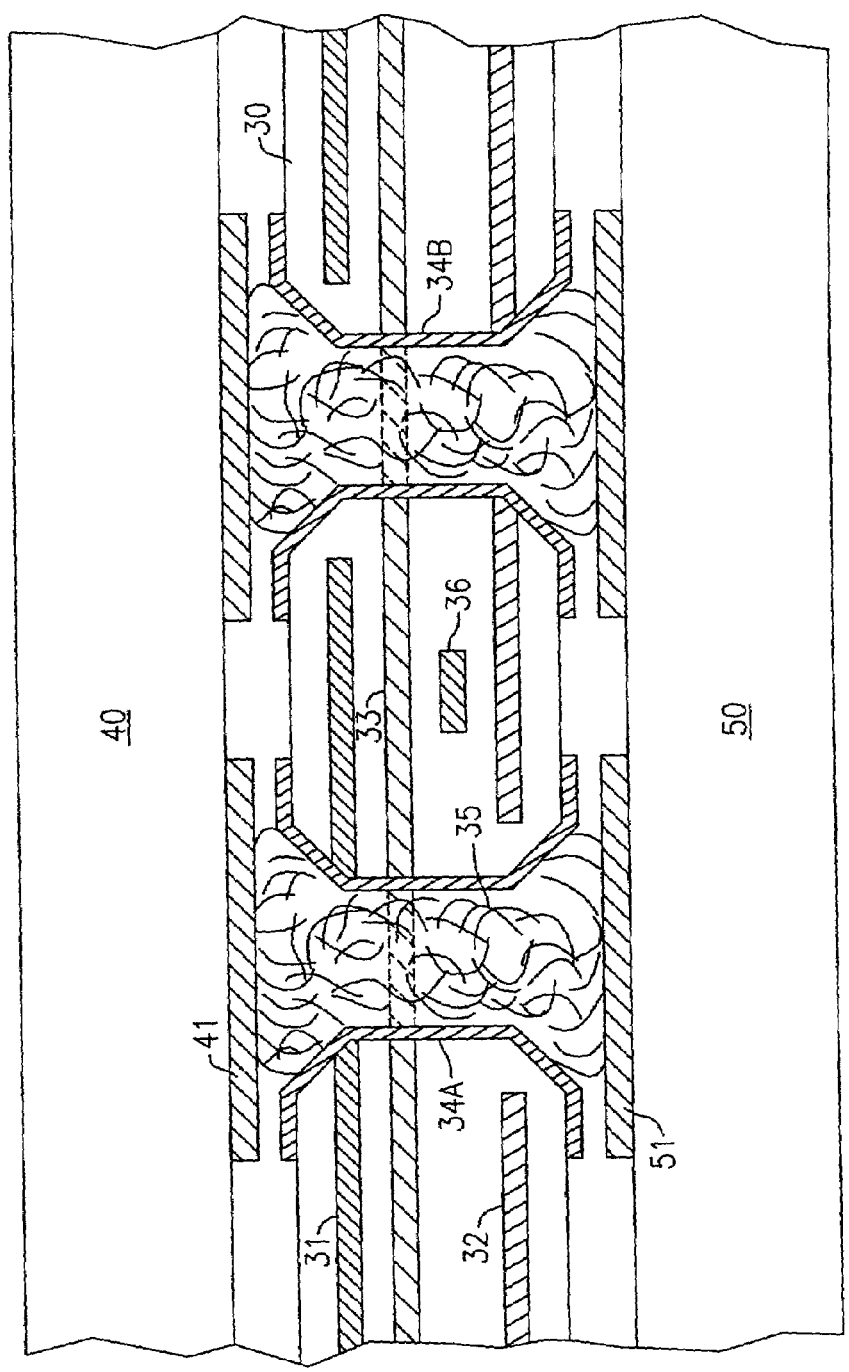
FIG. 1 illustrates a Land Grid Array (LGA) structure using a multi-layer flex film structure (30) composed of two conductive reference planes (31,32), two signal layers (36, 33), and a plurality of our provided Plated Through Holes (herein PTH) that are located between the Multi-Chip Module MCM (40) (or similar type chip carrier) and the System board (50) of the Land Grid Array (LGA) structure.
Figure 2:
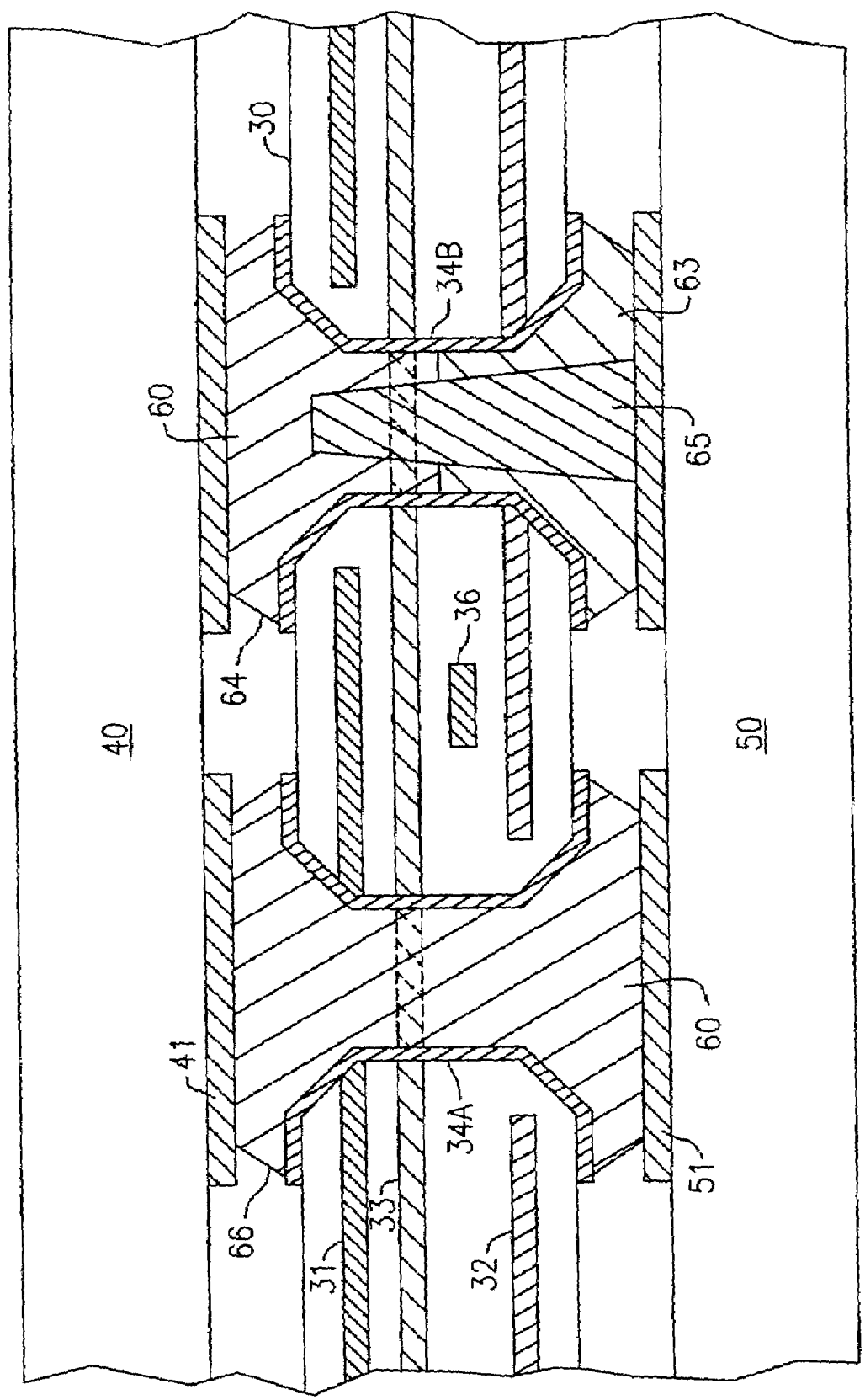
FIG. 2 details the improved structure for an LGA interposer and also shows a new alternative to the injection method for the electrical connection.

As shown in FIG. 1, a multi-layer flex film structure (30) is composed of two reference planes (31,32), two signal layers (36,33), and a plurality of our provided Plated Through Holes (herein PTH) (PTHs are generally 34 and shown in the sections illustrated at 34A, 34B) that are located between the Multi-Chip Module MCM (40) (or similar type chip carrier) and the System board (50). For the Cinch connection scheme, a fuzz button (35) is inserted in the PTH (34A), thus providing the electrical connection between the MCM (40) and the System board (50) via the contacting pads (41) and (51). For PTHs that are connected to power or ground locations on the System board (50) and MCM (40), the corresponding power or ground plane within the flex film is connected to the respected PTH. In the example shown in FIG. 1, reference plane (31) is connected to PTH (34A) and reference plane (32) is connected to PTH (34B). In addition, the use of plated through holes (34A, 34B) in the flex carrier (30), allows for more areas of electrical contacts within and to the fuzz button (35) structure from the MCM (40) to the system board (50) side of the interposer. The use of PTHs in the flex film carrier will reduce the overall resistance of the connections as well as increase their overall reliability. FIG. 2 details the improved structure of the Tyco LGA interposer on the left side of the FIG. 2 and our improvement in accordance with our preferred embodiment, this design, on the right side of FIG. 2. Normally, the electrical connection is provided by an injected connecting conductor (60) made from conductive polymer (e.g., sliver impregnated silicone) that is injected into a PTH (34A). FIG. 2 also shows a new alternative to the injection method for the electrical connection. In this case, the connector (60) is composed of two polymer halves (63, 64) that are riveted together into the PTH (34B) by a polymer or other suitable material rivet expansion pin (65). In an example of our preferred embodiment, this rivet expansion pin (65) is an integral part of the base part (63) half of the polymer conductor (60). Again, the use of plated through holes (34A, 34B), reduces the resistivity of the electrical connection as well increases its overall reliability. In addition, the riveting technique will also provide a means for simplified modifications of a signal connection when used with the proposed EC application. In both FIGS. 1 and 2, a capacitive structure is formed between the conductive reference planes (31) and (32). The reference plane (31) is connected to PTH (34A) and reference plane (32) is connected to PTH (34B). This provides for a highly decoupled power distribution structure under the MCM (40).

2) Capacitive Decoupling Only

Figure 7:
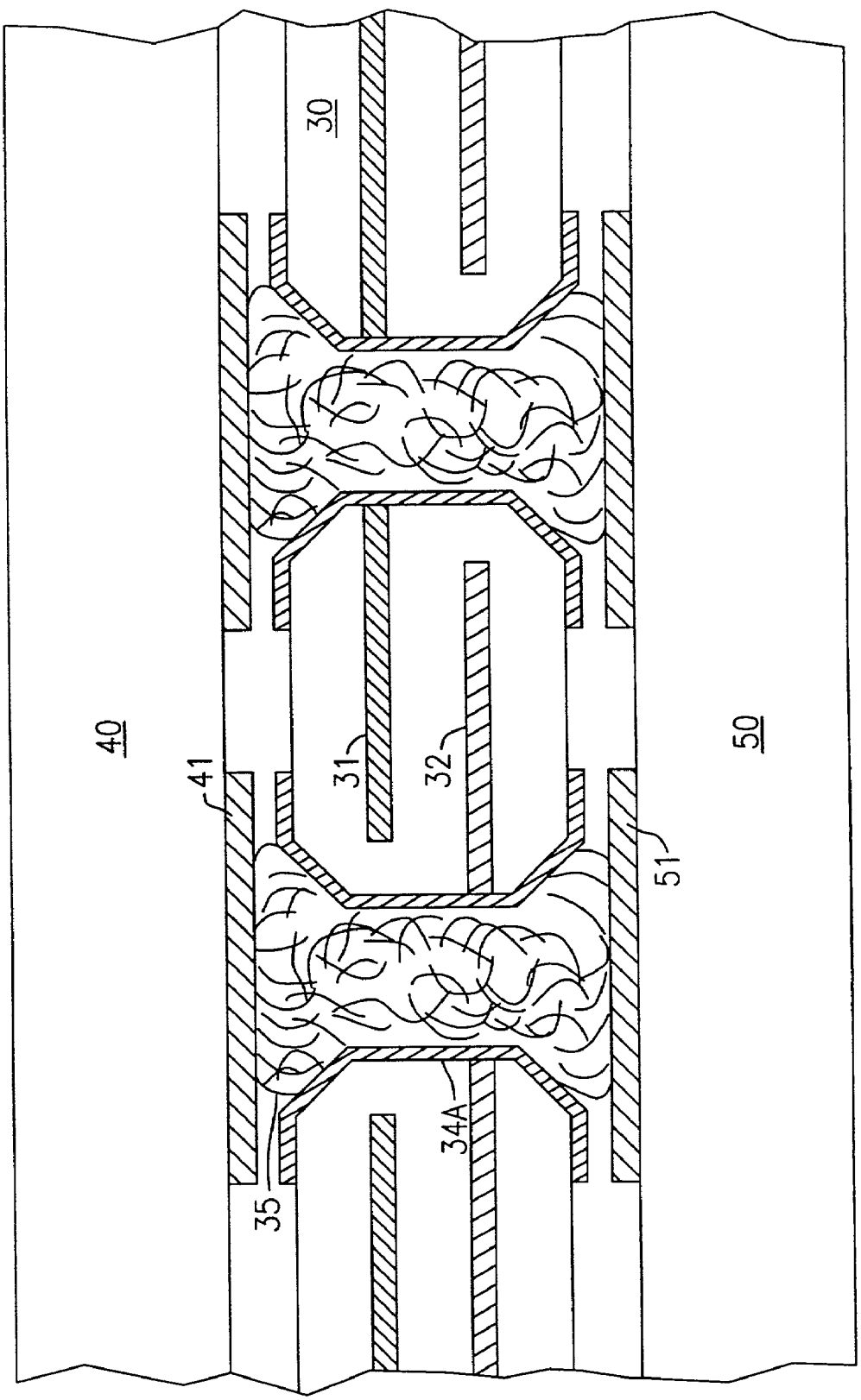
FIG. 7 illustrates our method for providing decoupling of the power supplies.

A simpler method for providing decoupling of the power supplies can be accomplished by the example illustrated in FIG. 7. In this example, the Flex Film (30) contains two or more conductive reference planes connected using a structure described for the Cinch type connector scheme. In this case, the reference plane (31) is connected to the PTH (34A) and likewise the reference plane (32) is connected to another PTH (34A). By doing so, a highly decoupled power supply structure is formed within the flex film carrier.

Another application of that application described in FIG. 1 would be to interchange the reference and signal planes within the flex film carrier and reducing the dielectric thickness between the reference planes. In addition, the dielectric constant of only the insulator between the conductive reference planes could be increased as high as necessary. By doing this, the capacitive decoupling between the reference planes is increased higher then that for the case illustrated in FIG. 1. The advantage for doing would be seen when the requirement for decoupling of the supplies exceeds the requirements for the signal integrity, the parameters of the EC repair and that the higher dielectric constant did not adversely impact the signal integrity of the nets that passed through the flex film.

3) EC Repair Only

Figure 3:
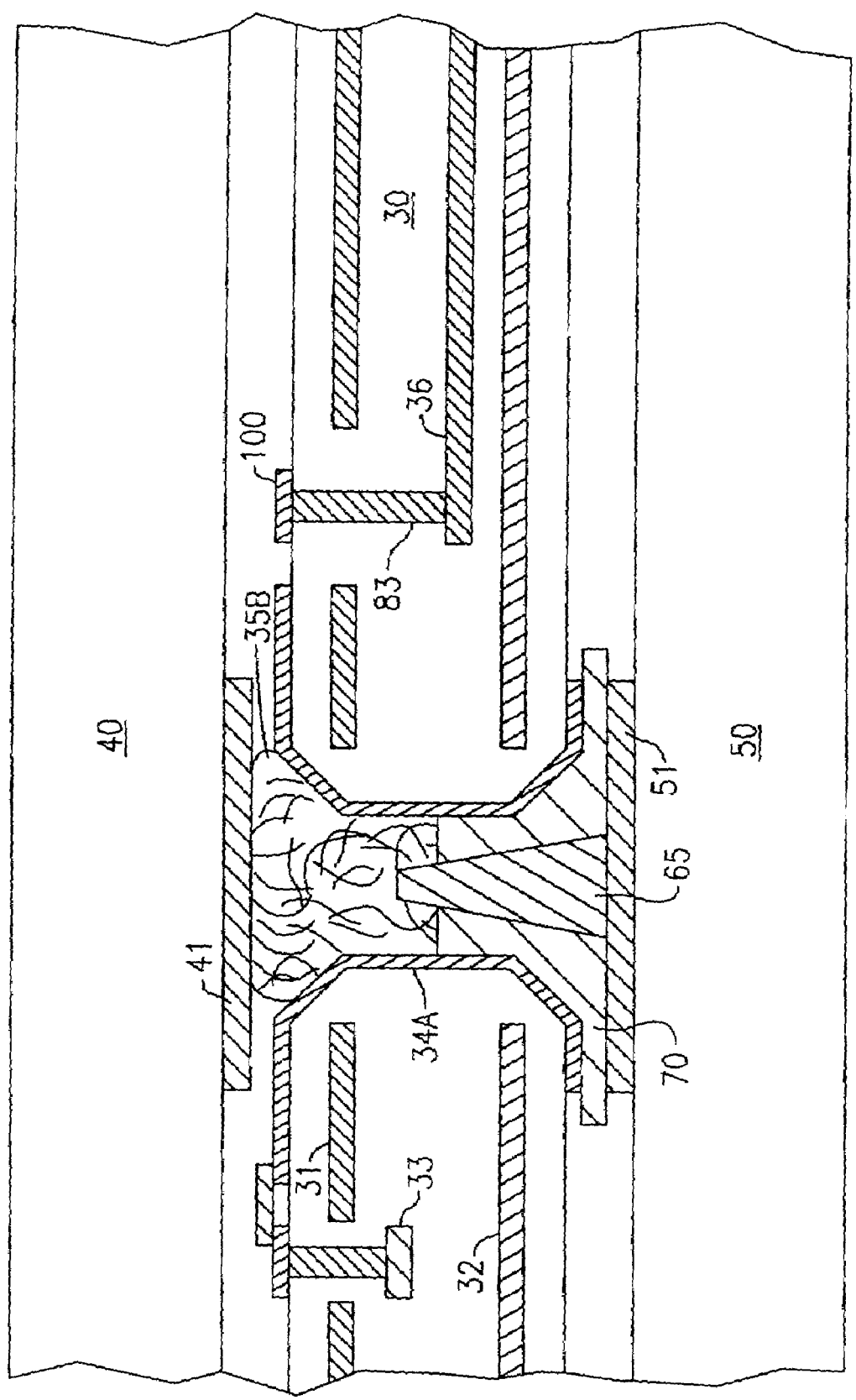
FIG. 3 illustrates the embodiment for preferred EC (Engineering Change) repair structure for a Cinch connection scheme where repair is initiated by the removal of an original fuzz button (35) and the installation of an insulated polymer plug into the PTH (34A) from the System board (50).

The formation of the EC repair structure for the Cinch connection scheme is shown in FIG. 3. Repair is initiated by the removal of the original fuzz button (35) and the installation of an insulated polymer plug into the PTH (34A) from the System board (50) side of the carrier. This plug is composed of two parts, the first being the plug body (70) and the second being the expansion pin (65). The expansion pin (65) helps to secure the insulating plug (70) into the PTH (34A). The thickness of the plug body (70) where it contacts the pad (51) is adjusted to be compatible with the normal separation between the carrier (30) and the system board (50). This insulator plug will then remove all conflicts of the system board net with the EC repair. Next, a replacement fuzz button (35B), which is smaller than the original button (35), is inserted into the PTH (34A). Completion of the EC is accomplished by using a small metal jumper (80) between the top surface metal of the PTH (34A) and the corresponding terminal pad (100) of the X (33) and Y (36) wires that are within the flex film carrier (30).

Figure 4:
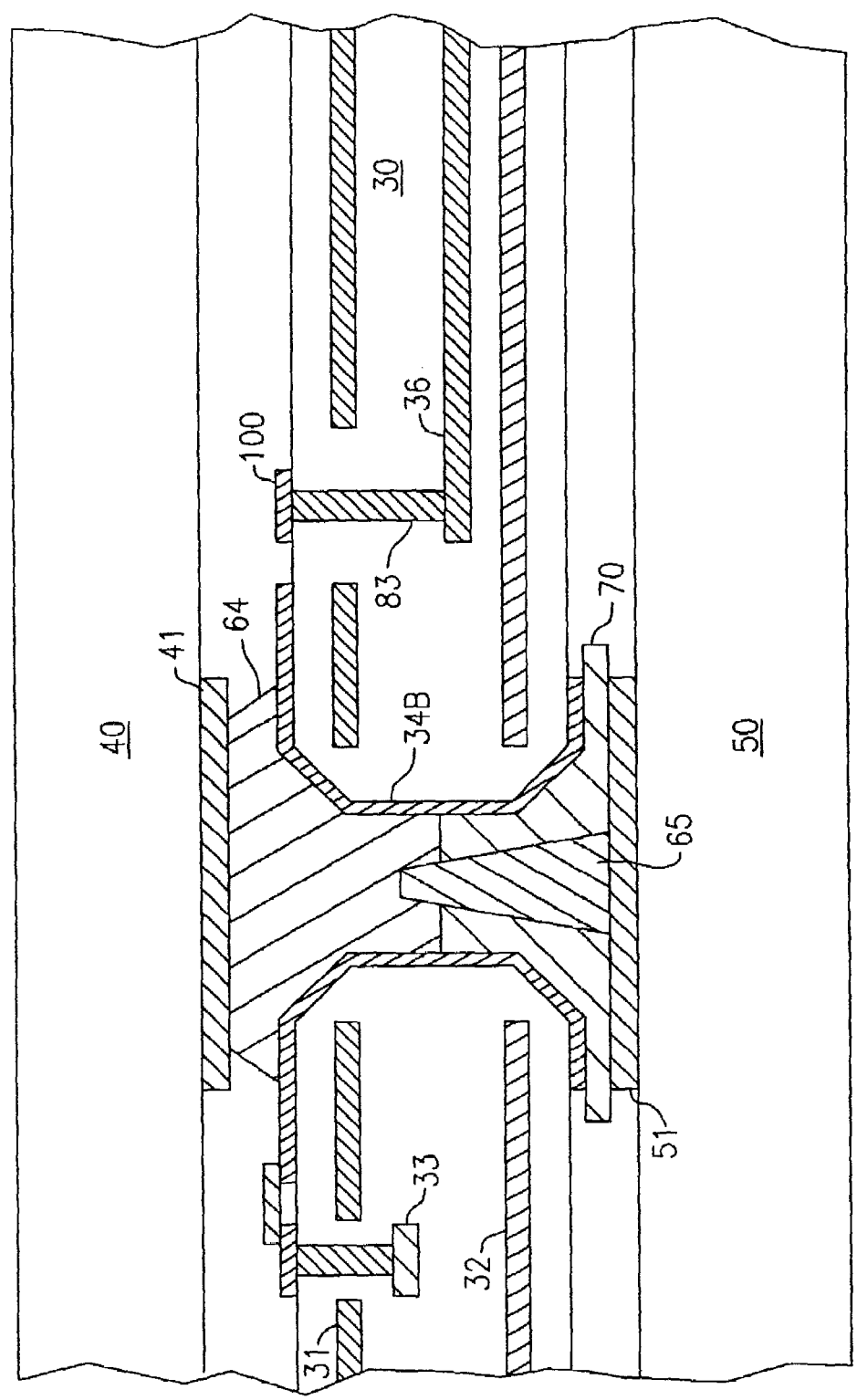
FIG. 4 illustrates EC repair structure for an improved representative Tyco LGA connector structure.

The method for EC repair structure for a representative Tyco structure is shown in FIG. 4. Repair is initiated by the removal of the original polymer structure (60). This is accomplished in one of two methods. If the polymer structure was formed by injection, the signal contact is removed by cutting the crown (66) off and pushing the remaining structure out of the PTH (34B). If the structure was formed by the method of a rivet, then the rivet expansion pin (65) is removed and the conductive segment (63) is removed. Then an insulated polymer plug (70) is inserted into the PTH (34B) from the system board (50) side of the carrier and a replacement cap (64) is inserted and held with a pin (65). Completion of the EC is accomplished by using a small metal jumper (80) between the top surface metal of the PTH (34A) and the corresponding terminal pad (100) of the X (33) and Y (36) wires within the flex film carrier (30).

Figure 5:
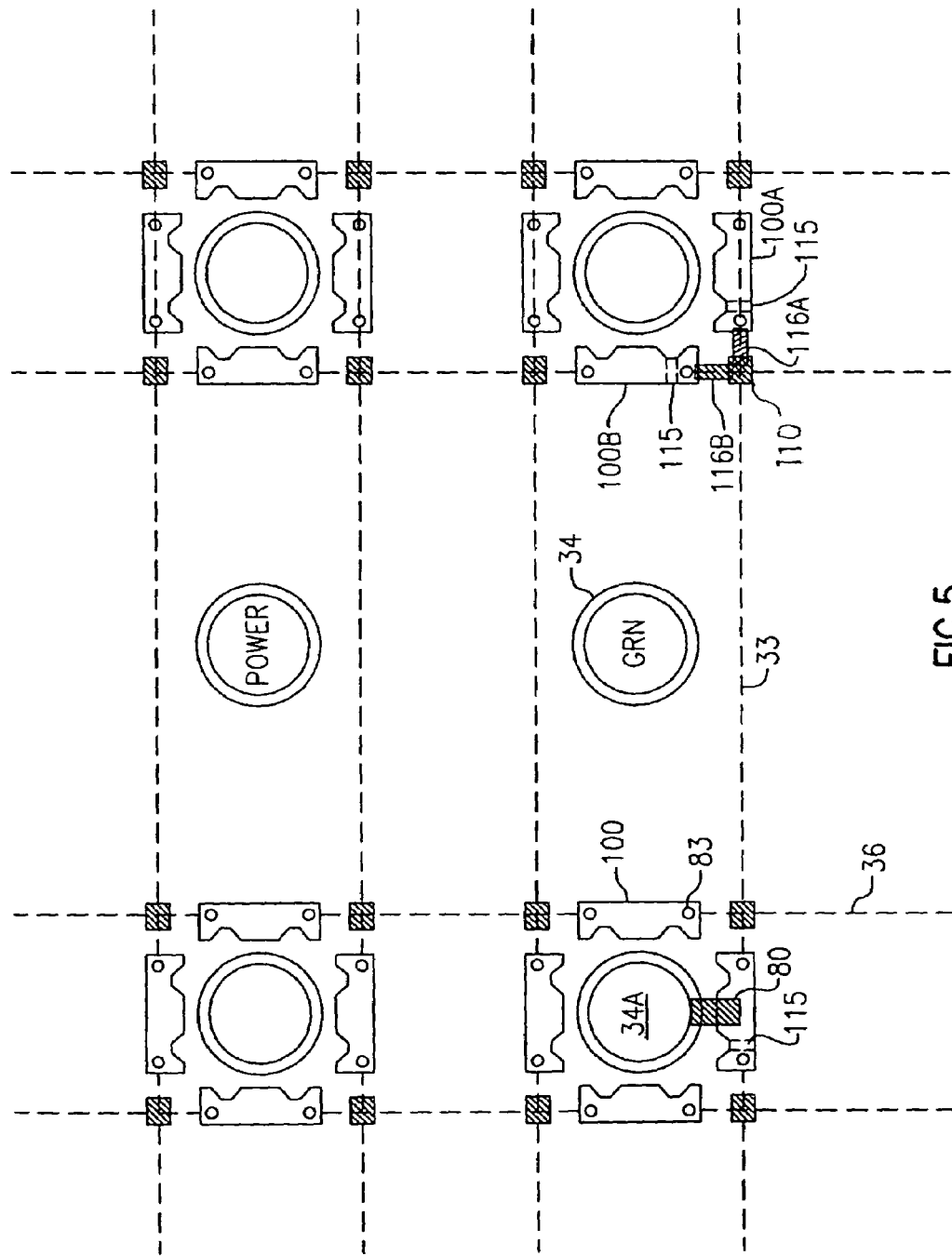
FIG. 5 further illustrates the EC structure repair.

A further explanation of the method for creating a EC structure can be seen in FIG. 5 and the following text. A signal at location (34A) is removed from the system board net by one of the proceeding methods. To further the repair, a top surface structure is formed around each signal location. Four terminal patterns (100) are placed on the sides of the signal PTH (34A) and are connected to the imbedded X (33) and Y (36) signal repair wires through the Vias (83). In addition, a turnabout pad (110) is placed in the corner area formed by the X and Y placement of the terminal land pattern (100). A metal jumper (80) is formed either by plating, screening, sputtering, or by discrete wire. A deletion on the land pad (100) is made at the notched location (115). The deletion at this point can be made by mechanical removal of the notch area or by laser cutting. This removes the unwanted imbedded X or Y wire from the repair. To change directions within the repair, jumpers (116A, 116B) are used to connect the terminal land pattern (100A, 100B) to the turnabout pad (110). Thus by using the X and Y wires with turnabout pads, repairs can be wired out in any direction of a high density array of connections to awaiting spare nets outside of the MCM placement.

Figure 6:
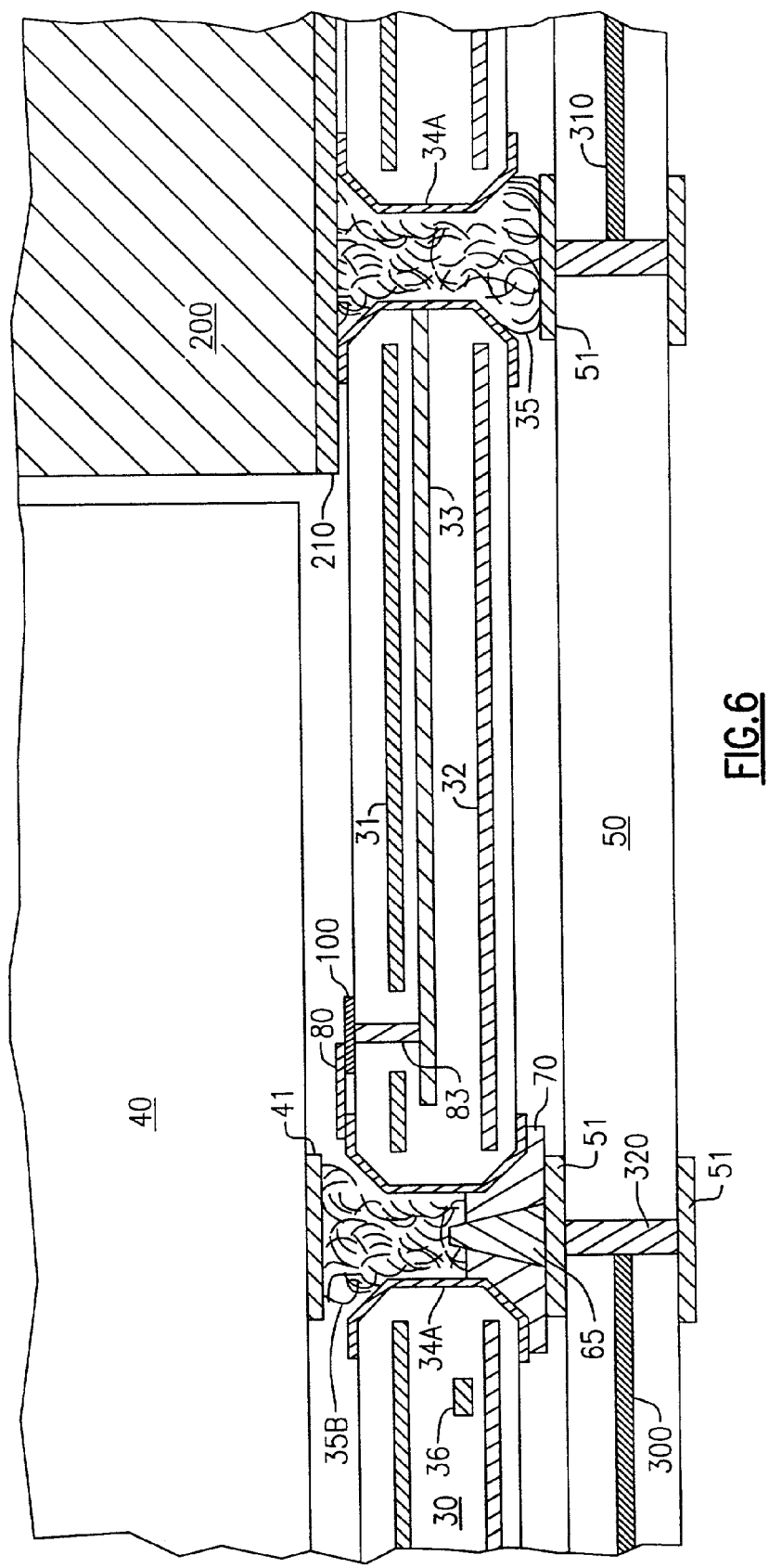
FIG. 6 shows a cross sectional view of a completed EC repair to a spare system board net for a Cinch connnection scheme.

A cross sectional view of a completed EC repair to a spare system board net is shown in FIG. 6. It can be seen that the Cinch EC repair is applied to remove the original board net (300), although the EC repair could be applied to a structure made with the Tyco approach previously described. The insulating plug (70) prevents contact to the I/O pad (51) which in turn was connected to the board net (300) by a via (320). The net's path is now from the PTH (34A) through the connection strap (80) to the top surface land pattern (100).

Continuing from this pad (100) through to the via (83) to the imbedded wire X wire (33) which is then connected to another PTH (34A). This PTH is located outside of the MCM (40) area and is under part of the MCM retaining fixture (200). To prevent shorting of the fuzz ball (35) to the retaining structure an insulator (210) is installed between the flex film carrier (30) and the retaining fixture (200). Completion of the repair or EC is made by connection to the spare net (310) by the fuzz button (35) by compressing the stiffiner retaining structure (200) to finish the net.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A method of making an engineering change for a system board structure, comprising the steps of:
   providing a system board,
   providing a plurality of chip carrier modules for a next level of integration provided by a system board, at least one of which plurality of chip carrier modules has a functional connection that could be desirably changed,
   and providing a flex film carrier between the system board and the chip carrier modules that fulfills a desired engineering change by physically changing an original connection to another desired connection between said chip carrier modules that could be desireably changed and the system board,
   wherein said physically changing an original connection includes of
   inserting one or more insulating plugs on the system board to change said original connection to another to accomplish said physical changing of the original connection to another desired connection between the chip carrier modules and the system board.

2. A method of making an engineering change for a system board structure, comprising the steps of:
   providing a system board,
   providing a plurality of chip carrier modules for a next level of integration provided by a system board, at least one of which plurality of chip carrier modules has a functional connection that could be desirably changed,
   and providing a flex film carrier between the system board and the chip carrier modules that fulfills a desired engineering change by physically changing an original connection to another desired connection between said chip carrier modules that could be desireably changed and the system board,
   wherein said physically changing an original connection includes
   inserting one or more insulating plugs applied to remove an original board net and to prevent contact to an I/O pad which in turn was connected to the original board net.

3. A method of making an engineering change for a system board structure, comprising the steps of:
   providing a system board,
   providing a plurality of chip carrier modules for a next level of integration provided by a system board, at least one of which plurality of chip carrier modules has a functional connection that could be desirably changed,
   and providing a flex film carrier between the system board and the chip carrier modules that fulfills a desired engineering change by physically changing an original connection to another desired connection between said chip carrier modules that could be desireably changed and the system board,
   wherein said step of physically changing an original connection includes making changes with a connector composed of two polymer halves that are riveted together into plated through holes in said flex film carrier by a conductive rivet expansion pin which forms part of a base half of the conductor making the connection through the plated through holes which reduce the resistivity of the electrical connection.

4. The method of making an engineering change for a system board structure according to claim 3, wherein said step of making changes with a connection composes of two polymer halves includes insertion of an insulating part of said two polymer halves that are rivited together.

5. The method of making an engineering change for a system board structure according to claim 3, wherein in making said desired connection a top surface structure is formed around each signal location including four terminal patterns placed on the sides of plated through holes forming signal plated through holes which are connected to imbedded X and Y signal repair wires through the plated through holes which form vias and a turnabout pad is placed in the corner area formed by a X and Y placement of the terminal land pattern.

6. The method of making an engineering change for a system board structure according to claim 5, wherein in making a change in direction for said desired connection a metal jumpers are used to connect the terminal land pattern to the turnabout pad.

7. The method of making an engineering change for a system board structure according to claim 6, wherein, while making a change, a repair is applied to remove an original board net with said insulating plug preventing contact to a board I/O pad which in turn was connected to the board net by a via whereby a repaired net's path is formed from a plated through hole through a connection strap to the top surface land pattern and continuing from this pad through to the via to an imbedded wire X which is then connected to another plated through hole located outside of said chip carrier module area and under a part of a chip carrier's retaining fixture.

8. The method of making an engineering change for a system board structure according to claim 7, wherein in making said change to prevent shorting of a fuzz ball (35) to the retaining structure an insulator is installed between the flex film carrier and the retaining fixture and completion of the repair or engineering change is made by connection to a spare net by a fuzz button.

9. The method of making an engineering change for a system board structure according to claim 7, wherein completion of the repair or engineering change is made by connection to a spare net by the a fuzz button by compressing a stiffiner retaining structure to finish the net.

10. A method of making an engineering change for a system board structure, comprising the steps of:
    providing a system board,
    providing a plurality of chip carrier modules for a next level of integration provided by a system board, at least one of which plurality of chip carrier modules has a functional connection that could be desirably changed,
    and providing a flex film carrier between the system board and the chip carrier modules that fulfills a desired engineering change by physically changing an original connection to another desired connection between said chip carrier modules that could be desireably changed and the system board, wherein said physically changing an original connection includes initiating repair or engineering change to change said original connection to another to accomplish said physical changing of the original connection to another desired connection between the chip carrier modules and the system board by the removal of the original polymer structure passing through plated through holes of via(s) of a desired connection change and then an insulated polymer plug is inserted into the plated through holes being changed from the system board side of the carrier and a replacement cap is inserted and held with a pin.

11. The method of making an engineering change for a system board structure according to claim 10, wherein said step of physically changing an original connection includes the step of completion of a repair or engineering change by using a small metal jumper between the top surface metal of the plated though hole via being changed and a corresponding terminal pad of X and Y wires within the flex film carrier.

12. A method of making an engineering change for a system board structure, comprising the steps of:

providing a system board, providing a plurality of chip carrier modules for a next level of integration provided by a system board, at least one of which plurality of chip carrier modules has a functional connection that could be desirably changed, and providing a flex film carrier between the system board and the chip carrier modules that fulfills a desired engineering change by physically changing an original connection to another desired connection between said chip carrier modules that could be desireably changed and the system board, wherein said step of physically changing an original connection includes initiating repair or engineering change to change said original connection to another to accomplish said physical changing of the original connection to another desired connection between the chip carrier modules and the system board by removal of an original fuzz button and installation of an insulated polymer plug into plated through hole for the original connection being changed from the system board side of the carrier.

13. The method of making an engineering change for a system board structure according to claim 12, wherein said insulated polymer plug is composed of two parts, the first being the plug body and the second being an expansion pin which helps to secure the insulating plug into the plated through hole and adjusting the thickness of the plug body where it contacts a terminal pad to be compatible with the normal separation between the chip carrier modules and the system board to remove conflicts of the system board net with the repair or engineering change.

14. The method of making an engineering change for a system board structure according to claim 13, wherein a replacement fuzz button which is smaller that an original button at said plated through hole being changed is inserted into the plated through hole and completion of the repair or engineering change uses a metal jumper between the top surface metal of the plated through holes and the corresponding terminal pad of X and Y wires the are within the flex film carrier.

15. A method of making an engineering change for a system board structure, comprising the steps of:

providing a system board, providing a plurality of chip carrier modules for said the next level of integration provided by a system board, at least one of which plurality of chip carrier modules has a functional connection that could be desireably changed, and providing a flex film carrier between the system board and the chip carrier modules that fulfills a desired engineering change by physically changing an original connection to another desired connection between said chip carrier modules that could be desireably changed and the system board, wherein an original connection normally is provided by a conductor made from two conductive polymer halves that are riveted together into the plated through holes with a conductive expansion rivet pin.

16. The method of making an engineering change for a system board structure according to claim 15, wherein the rivet pin is an integral part of the base part half of the conductive polymer conductor to create a capacitive structure is formed between conductive reference planes of said flex film which provide for a highly decoupled power distribution structure under the chip carrier.

17. A method of making an engineering change for a system board structure, comprising the steps of:

providing a system board, providing a plurality of chip carrier modules for a next level of integration provided by a system board, at least one of which plurality of chip carrier modules has a functional connection that could be desirably changed, and providing a flex film carrier between the system board and the chip carrier modules that fulfills a desired engineering change by physically changing an original connection to another desired connection between said chip carrier modules that could be desireably changed and the system board, wherein said flex film contains two or more conductive reference planes connected using a structure with plated through holes in said Land Grid Array structure with one reference plane being connected to one plated through hold and likewise another reference plane is connected to another plated through hold to form a highly decoupled power supply structure is formed within the flex film carrier.

* * * * *